United States Patent
Nitta et al.

(10) Patent No.: US 7,347,766 B2
(45) Date of Patent: Mar. 25, 2008

(54) CUTTING METHOD AND CUTTING APPARATUS

(75) Inventors: Yuji Nitta, Tokyo (JP); Yuichi Shimizu, Tokyo (JP)

(73) Assignee: Disco Corporation, Tokyo (JP)

( * ) Notice: Subject to any disclaimer, the term of this patent is extended or adjusted under 35 U.S.C. 154(b) by 23 days.

(21) Appl. No.: 11/519,800

(22) Filed: Sep. 13, 2006

(65) Prior Publication Data
US 2007/0066188 A1    Mar. 22, 2007

(30) Foreign Application Priority Data
Sep. 16, 2005    (JP) ............... 2005-269625

(51) Int. Cl.
*B24B 1/00* (2006.01)
(52) U.S. Cl. .................. 451/11; 451/41; 451/910; 125/13.01; 125/16.01; 83/49; 83/956
(58) Field of Classification Search ........... 451/10, 451/11, 41, 910; 125/12, 13.01, 16.01, 19; 83/39, 49, 956
See application file for complete search history.

(56) References Cited

U.S. PATENT DOCUMENTS 4,790,465 A * 12/1988 Fellows et al. ............. 225/2
4,930,486 A *  6/1990 Kuromatsu .................. 205/662

FOREIGN PATENT DOCUMENTS

| JP | 01184104   | * |  7/1989 |
| JP | 02113907   | * |  4/1990 |
| JP | 2000-210928 |  |  8/2000 |
| JP | 2002-336775 |  | 11/2002 |

* cited by examiner

*Primary Examiner*—Eileen P. Morgan
(74) *Attorney, Agent, or Firm*—Wenderoth, Lind & Ponack, L.L.P.

(57) ABSTRACT

The invention provides a cutting method and a cutting apparatus that cuts without chipping a composite material consisting of laminated layers of crystal material and amorphous material, in which the amorphous material is cut with an ultrasonically vibrated cutting blade and the crystal material is cut with a cutting blade that does not ultrasonically vibrate. With such a method and apparatus, the crystal material portion and the amorphous material portion of the composite material can be cut cleanly without chipping.

10 Claims, 12 Drawing Sheets

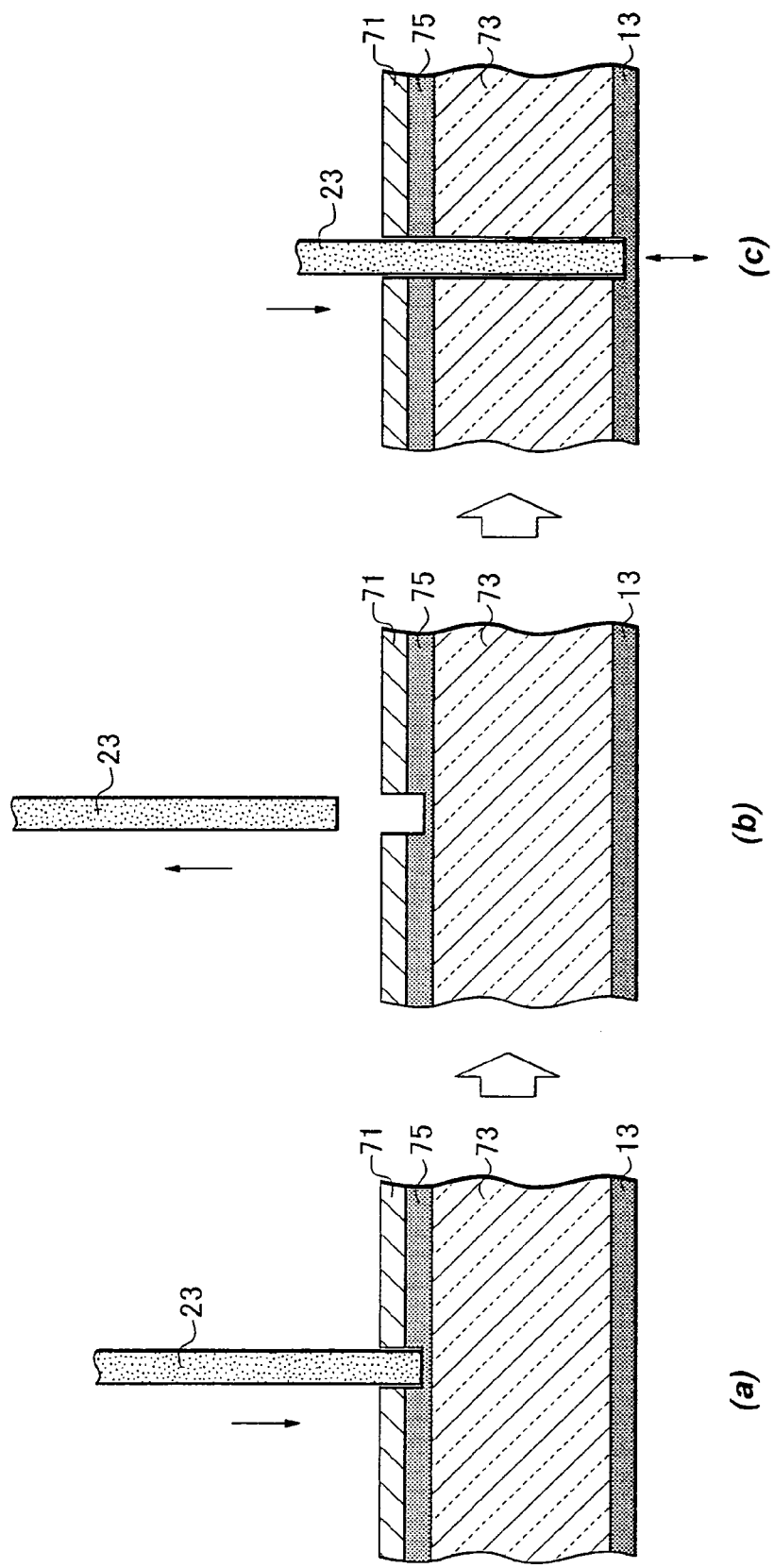

CUTTING METHOD AND CUTTING APPARATUS

BACKGROUND OF THE INVENTION

1. Field of the Invention

The present invention relates to a cutting method and a cutting apparatus for a workpiece, and more particularly, to a method of cutting composite material and a cutting apparatus for cutting composite material.

2. Related Art

In order to divide a semiconductor wafer into chips, a cutting apparatus such as a dicing apparatus is known in which the semiconductor wafer is cut by a cutting blade attached to a hub base. In a cutting apparatus of this type, restraining a rise in temperature at the point of contact between the blade and the workpiece as well as reducing the incidence of chipping without increasing cutting resistance are continuing technical problems. Consequently, cutting using ultrasonic vibration is being studied as one means of solving this problem. "Ultrasonic" means the range of sound above the frequencies audible to humans (approximately 20 kHz and above).

One example of a cutting method employing this type of ultrasonic vibration is JP-A-2002-336775, in which a method of cutting by ultrasonically vibrating a cutting blade is described. With this method, the cutting blade is bent in the direction of the thickness of the cutting blade (in the direction of the axis of rotation) and ultrasonically vibrated. A problem with this method is that, because a force acts to widen the cutting groove formed in the semiconductor wafer by the ultrasonically vibrated cutting blade, cutting resistance inevitably increases, leading to chipping of the devices formed from the wafer.

One method of solving this problem is disclosed in, for example, JP-A-2000-210928, which describes a method of cutting a workpiece by ultrasonically vibrating the cutting blade in the direction of the diameter of the blade. With this method, the ultrasonic vibration is transmitted in the direction of the axis of rotation of a spindle on which the cutting blade is mounted, the direction of vibration is changed by a vibration transmission direction converter mounted with the cutting blade, and the cutting blade is vibrated in the direction of the diameter of the blade.

Compared to the usual cutting process using a cutting blade that is not ultrasonically vibrated, cutting a workpiece with a cutting blade that is ultrasonically vibrated in the direction of the diameter of the blade as described above has the following advantages: (1) since the cutting resistance can be decreased, chipping can be restrained; (2) since cutting water can be supplied easily to the point of contact between the blade and the workpiece, the rise in temperature at the point of contact can be restrained and warping due to heat does not occur easily; (3) any contamination attached to the cutting blade is shaken off by the vibration, and therefore the cutting blade is uncontaminated; and (4) the load on the cutting blade is lightened, extending its life. In particular, this method can be expected to be able to cut cleanly such hard materials as quartz, glass and the like that are difficult to cut by dicing using conventional cutting blades.

However, it became clear that cutting a workpiece using a cutting blade that is vibrated in the direction of the diameter of the blade by ultrasonic vibration has the opposite of the effect intended, in that, depending on the type of material, the incidence of chipping increases compared to cutting with the usual cutting blade.

For example, an image sensing device such as a CCD or a C-MOS is a structure that uses an adhesive agent to bond together glass and silicon on the front surface of which circuits are formed.

With cutting using the usual cutting blade, because the blade cannot cut the glass portion, or the blade can cut the glass portion but the cutting speed with which the blade cuts the glass portion is slow or the quality of the cut diminishes and so forth, it has been difficult to cut the glass. Consequently, it was thought that, if the workpiece were cut with a cutting blade that is vibrated in the direction of the diameter of the blade by ultrasonic vibration, the glass portion could be cut cleanly.

However, when the above-described image sensing device such as a CCD or a C-MOS is cut with an ultrasonically vibrated cutting blade, although the glass portion is cut cleanly, the incidence of chipping increases by 10% over the conventional method.

Investigation of the relevant factors leading to such a high incidence of chipping indicates that, when cutting workpiece consisting of crystal material such as silicon with a cutting blade that is vibrated in the direction of the diameter of the blade using ultrasonic vibration, chipping occurs due to the cleavage of the crystal material.

SUMMARY OF THE INVENTION

Accordingly, the present invention is made in light of the above-described problem, and has as its object to provide a new and improved cutting method and cutting apparatus that enables optimal cutting without chipping of composite material composed of laminated layers of crystal material and amorphous material.

To achieve the above-described object, the present invention provides a cutting method for cutting with a cutting blade composite material in which crystal material and amorphous material are joined together, the cutting method comprising the steps of cutting the amorphous material portion of the composite material while ultrasonically vibrating the cutting blade in a direction of the diameter of the cutting blade, and cutting the crystal material portion of the composite material without ultrasonically vibrating the cutting blade.

With such a method, the crystal material and the amorphous material that together comprise the composite material are each cut with the cutting means best able to cut them. Specifically, the amorphous material portion is cut with a cutting blade that is ultrasonically vibrated in the direction of the diameter of the blade and the crystal material is cut with a cutting blade that is not ultrasonically vibrated. Such an arrangement enables cutting to be carried out without any chipping of either material portion.

The above-described cutting method can be executed by using a cutting apparatus comprising cutting means adapted to switch between a first cutting mode that cuts a workpiece by ultrasonically vibrating the cutting blade in the direction of the diameter of the cutting blade and a second cutting mode that cuts the workpiece without ultrasonically vibrating the cutting blade, and switching between the first cutting mode and the second cutting mode.

The cutting means comprises a spindle; a spindle housing that rotatably supports the spindle; a cutting blade attached to a hub base, the cutting blade being fixedly mounted on a proximal end part of the spindle; and a vibrator provided on the spindle that ultrasonically vibrates. In a first cutting mode, electric power is supplied to the vibrator and the vibrator is oscillated to produce an ultrasonic vibration, a direction of vibration of ultrasonic vibration transmitted in a direction of the axis of the spindle from the vibrator is converted to a direction of the diameter of the cutting blade, and a workpiece is cut by the cutting blade ultrasonically vibrating in the direction of the diameter of the cutting blade.

In addition, the above-described cutting method may also be executed using a cutting apparatus comprising a first cutting means for cutting a workpiece by ultrasonically vibrating a first cutting blade in the direction of the diameter of the cutting blade and a second cutting means for cutting a workpiece without ultrasonically vibrating a second cutting blade; cutting the amorphous material portion of the composite material with the first cutting means; and cutting the crystal material portion of the composite material with the second cutting means. It is therefore possible to choose between two cutting means according to the workpiece.

The first cutting means comprises a spindle; a spindle housing that rotatably supports the spindle; a cutting blade attached to a hub base, the cutting blade being fixedly mounted on a proximal end part of the spindle; and a vibrator provided on the spindle that ultrasonically vibrates. A direction of vibration of an ultrasonic vibration transmitted in a direction of the axis of the spindle from the vibrator is converted to a direction of the diameter of the cutting blade, and a workpiece is cut by the cutting blade ultrasonically vibrating in the direction of the diameter of the cutting blade.

The cutting blade may be inserted into the composite material from the same direction in the step of cutting the amorphous material portion and in the step of cutting the crystal material portion. Alternatively, the cutting blade may be inserted into the composite material from opposite directions in the step of cutting the amorphous material portion and in the step of cutting the crystal material portion.

In addition, for the composite material, for example, the amorphous material may be glass and the crystal material may be silicon.

The present invention as described above can provide a cutting method and a cutting apparatus that can cut without chipping all portions of a composite material composed of laminated layers of crystal material and amorphous material.

Other features and advantages of the present invention will be apparent from the following description when taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 6 is a diagram illustrating steps in a cutting process according to a first cutting method;

DETAILED DESCRIPTION OF THE PREFERRED EMBODIMENTS

Figure 1:
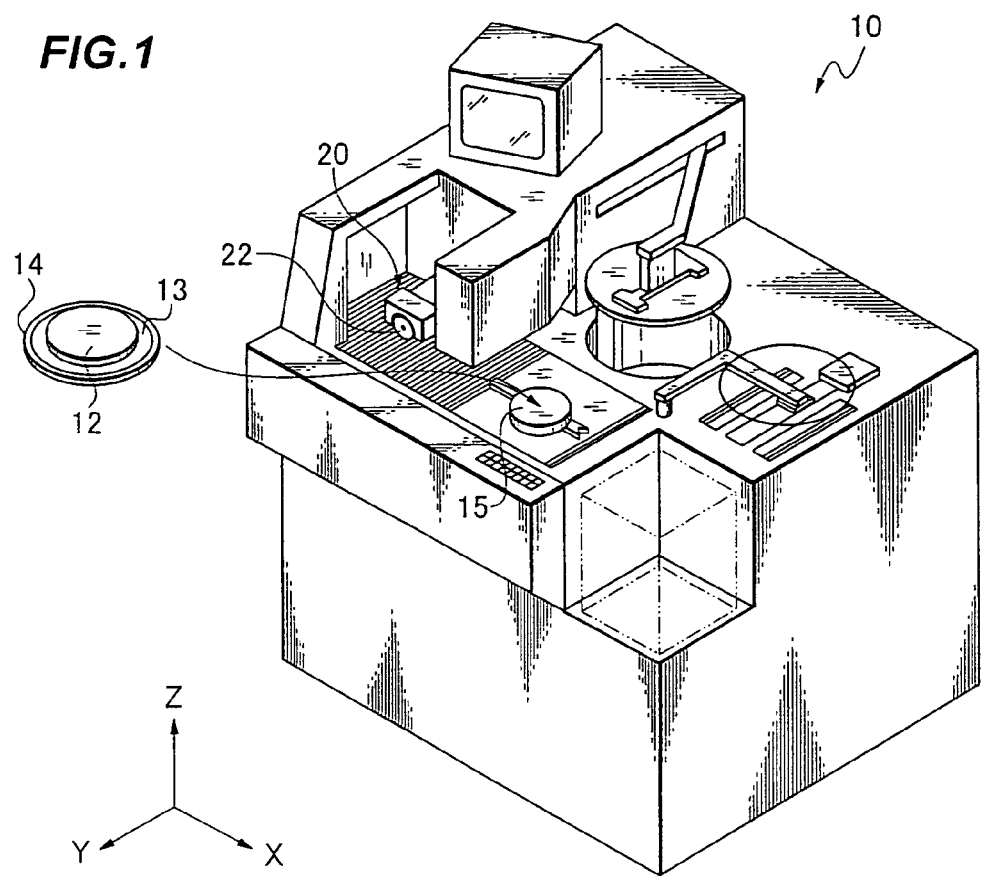
FIG. 1 is a schematic perspective view of a cutting apparatus according to a first embodiment of the present invention.

A detailed description will now be given of a preferred embodiment of the present invention, with reference to the accompanying drawings in which structural elements have substantially identical functional structures are given identical reference numerals and redundant descriptions thereof are omitted.

First Embodiment

First, using FIG. 1, a description is given of the overall structure of a cutting apparatus 10 composed as one example of an ultrasonic vibration cutting apparatus according to a first embodiment of the present invention.

As shown in FIG. 1, the cutting apparatus 10 comprises, for example, a cutting unit 20 that cuts a workpiece 12 such as a semiconductor wafer or the like, a chuck table 15 as one example of a holding means for holding the workpiece 12, a cutting unit moving mechanism (not shown), and a chuck table moving mechanism (also not shown).

The cutting unit 20 comprises a cutting blade 22 attached to a spindle. By forcing the tip of the blade into the workpiece 12 while rotating the cutting blade that ultrasonically vibrates in the direction of the diameter of the blade at high speed, the cutting unit 20 can cut the workpiece 12 and form an extremely thin kerf (cut groove).

In addition, the chuck table 15 is, for example, a disk-shaped table with a flat top surface, with a vacuum chuck or the like (not shown), on top. The workpiece 12 is placed on the chuck table 15 supported by a frame 14 through dicing tape 13, by which the workpiece 12 is suctionally attached to the chuck table 15 and can be stably held in place thereon.

The cutting unit moving mechanism moves the cutting unit 20 in the direction of the Y-axis. The Y-axis direction is the horizontal direction perpendicular to the cutting direction (the X-axis), for example, the axial direction of a spindle disposed within the cutting unit 20. This type of movement along the Y-axis can align the tip of the cutting blade with a cutting position (a cutting line). In addition, the cutting unit moving mechanism can also move the cutting unit 20 in the direction of the Z-axis (the vertical direction), which enables the depth of the cut of the cutting blade into the workpiece 12 to be adjusted, a contact set-up for detecting a reference position of the cutting blade to be executed, and so forth.

The chuck table moving mechanism, during the usual dicing process, moves the chuck table 15 holding the workpiece 12 reciprocally in the cutting direction (along the X-axis), so that the tip of the cutting blade 22 traces a straight line on the workpiece 12.

Moving the cutting unit 20 and the chuck table 15 relative to each other while forcing the cutting blade 22, which is rotating at high speed, into the workpiece 12 enables the cutting apparatus 10 having the construction described above to cut the workpiece 12 in a grid-like fashion, in other words to dice.

Figure 2:
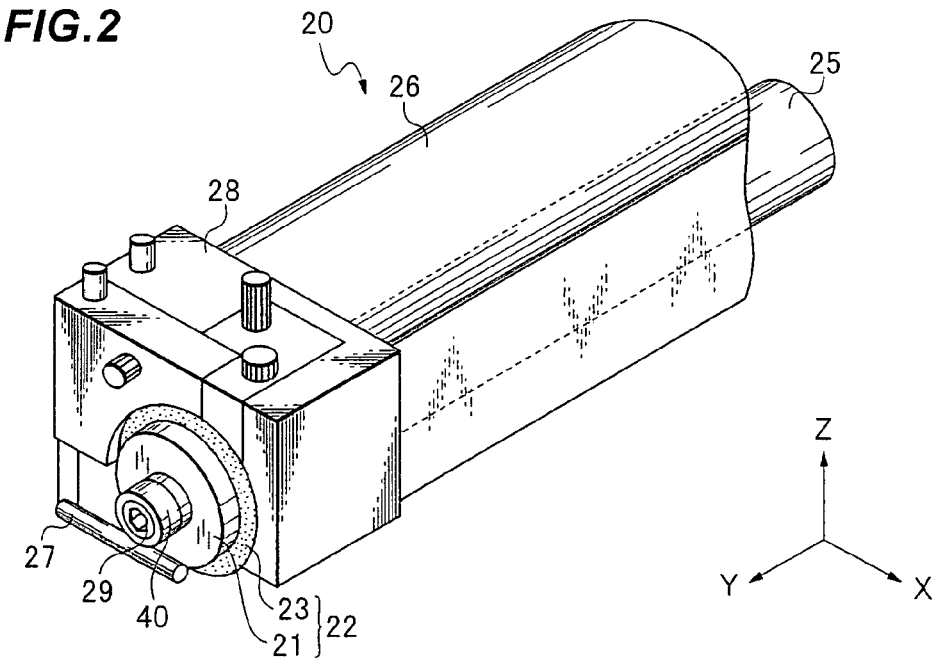
FIG. 2 is a perspective view of a cutting unit according to the embodiment.

Next, using FIG. 2, a description is given of the general structure of the cutting unit 20 according to the present embodiment. It should be noted that FIG. 2 is a perspective view of the cutting unit 20 according to the present embodiment.

As shown in FIG. 2, the cutting unit 20 chiefly comprises, for example, the cutting blade 22 composed of a blade part 23 and a hub base 21 formed as a single integrated unit, a spindle 25 to a proximal end part of which is attached the cutting blade 22, a spindle housing 26 that rotatably supports the spindle 25, a cutting water supply nozzle 27, a wheel cover 28, a bolt 29 and an adjustment member 40.

The cutting blade 22 is a hub blade consisting of the substantially ring-shaped, ultra-thin blade part 23 and the hub base 21 that supports the blade part 23 formed as a single integrated unit. The hub base 21 is formed of an electrically conductive material such as a metal material or the like, for example aluminum. The blade part 23 is formed by attaching abrasive particles of a material such as diamond to the hub base 21 by for example electro-deposition, disposed on the outer periphery of the cutting blade 22. With the hub base 21 and the blade part 23 formed into a single integrated unit as described above so as to be mutually inseparable, there is thus no gap between the two parts and therefore the structure is suitable for the transmission of ultrasonic vibrations.

The cutting blade 22 is attached to the proximal end part, not shown, of the spindle 25 by, for example, the bolt 29. At this time, the substantially rod-shaped adjustment member 40 is also attached to one side of the cutting blade 22. The attachment structure of the cutting blade 22 and the adjustment member 40 are described in detail later, with reference to FIG. 3.

In addition, the spindle 25 is a rotating shaft for transmitting the torque of a motor (not shown) to be described later to the cutting blade 22, and rotates the attached cutting blade 22 at high speed, for example 30,000 rpm. Most of the spindle 25 is covered by the spindle housing 26, but the proximal end part of the spindle 25 projects from the spindle housing 26 and is exposed, and it is to this proximal end part that the cutting blade 22 is attached.

The spindle housing 26 is a housing that is provided to cover the spindle 25, and is capable of supporting the spindle 25 rotatably at high speed using an air bearing provided therewithin. A detailed description of the spindle housing is given later, with reference to FIG. 3.

The cutting water supply nozzle 27 may be detachably attached to both sides of the cutting blade 22, and supplies cutting water to the sides of the cutting blade 22 and to the vicinity of the point of contact between the blade and the workpiece 12 so as to cool both the blade and the workpiece 12. In addition, the wheel cover 28 is provided so as to cover the outer periphery of the cutting blade 22, and both protects the cutting blade 22 as well as prevents the cutting water and the cutting waste from splattering.

The cutting unit 20 having the construction described above rotates the cutting blade 22 at high speed using the spindle 25 and moves the blade part 23 of the cutting blade 22 into the workpiece 12, which enables the cutting unit 20 to cut the work surface of the workpiece 12 and form an extremely thin kerf (cut groove) along a cutting line.

Figure 3:
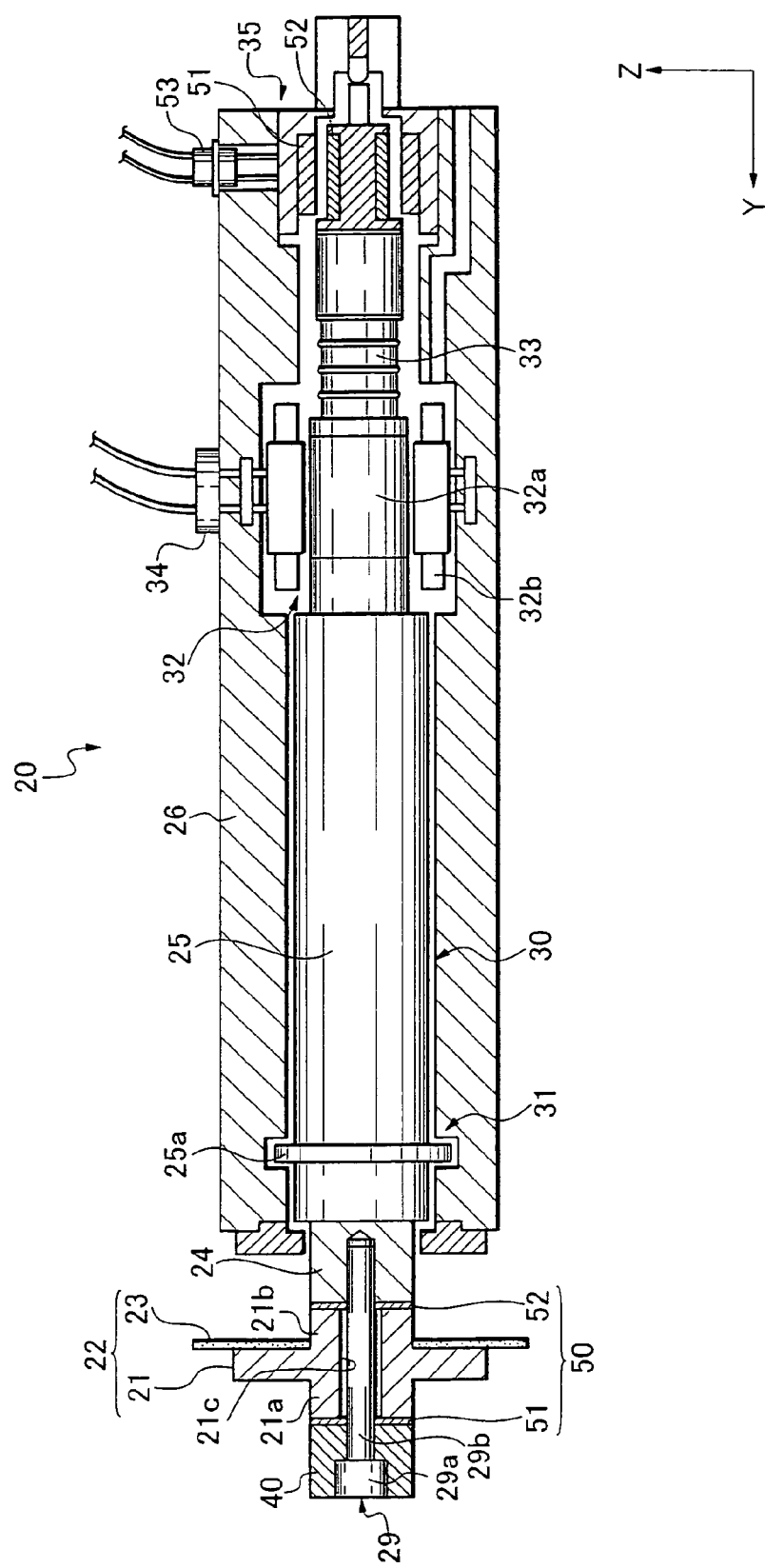
FIG. 3 is a vertical sectional view showing the internal structure of a spindle housing of the cutting unit according to the embodiment.

Next, the internal construction of the spindle housing 26 and the attachment mechanism of the cutting blade 22 is described in detail using FIG. 3. It should be noted that FIG. 3 is a vertical section view of the internal construction of the spindle housing in the cutting unit 20 of the present embodiment As shown in FIG. 3, provided within the cutting unit 20 spindle housing 26 are: the spindle 25; a radial air bearing 30 and a thrust air bearing 31 that rotatably support the spindle 25; an air supply path (not shown) for supplying high-pressure air to the radial air bearing 30 and the thrust air bearing 31; an exhaust path (not shown) for exhausting air expelled by the radial air bearing 30 and the thrust air bearing 31; a motor 32 possessing a rotor 32a and a stator 32b; a stator power supply part 34 for supplying the stator 32b with electric power; an ultrasonic vibrator 33, for example a lead zirconium titanate (PZT) vibrator, provided on a distal end part side of the spindle 25; and a contactless power supply device 35 for supplying power to the PZT vibrator 33.

Specifically, the rotor 32a, which is a rotating shaft composed the motor 32, is provided on the distal end of the spindle 25. When the stator 32b is supplied with power by the stator power supply part 34, torque is generated by the interaction of the rotor 32a and the stator 32b, and the spindle 25 is rotated at high speed by this torque. In addition, a thrust plate 25a having a larger diameter than that of the spindle 25 is provided on the proximal end of the spindle 25.

By expelling air toward the outer periphery of the spindle 25, the radial air bearing 30 supports the spindle 25, which is spinning at high speed, in a radial direction (that is, in the direction of the X-Z plane). At the same time, by expelling air at the thrust plate 25a, the thrust air bearing 31 supports the spindle 25, which is rotating at high speed, in a thrust direction (that is, in the direction of the Y-axis).

The above-described spindle 25, the spindle housing 26, the radial air bearing 30, the thrust air bearing 31 and the motor 32 together form an air spindle mechanism that enables the spindle 25, which is rotating at high speed, to be contactlessly supported.

Moreover, the PZT vibrator 33, which is an electrostrictive vibrator, for example, is provided on the spindle 25 as an ultrasonic vibrator, as is a contactless power supply device 35 for supplying power to the PZT vibrator 33.

The PZT vibrator 33 is disposed on the distal side of the spindle 25 (that is, the side opposite the cutting blade 22), distal of the rotor 32a. The PZT vibrator 33 may be a bolt-clamped Langevin-type vibrator composed of piezoelectric ceramics material such as lead zirconium titanate (PZT). It should be noted that the vibrator is not limited to the electrostrictive vibrator described herein, and thus, alternatively, for example, it is possible to use a magnetostrictive vibrator.

The contactless power supply device 35 consists of a primary transformer 51 that is a transformer on the power supply side disposed on the inner peripheral surface of the spindle housing 26, a secondary transformer 52 that is a transformer on the power reception side disposed on the distal end of the spindle 25, and a power supply terminal 53 that connects an external power source (not shown) and the primary transformer 51. The contactless power supply device 35 having such a construction contactlessly transmits by magnetic induction electric power supplied from the external power source via the power supply terminal 53 from the primary transformer 51 to the secondary transformer 52, and further, to the PZT vibrator 33 through the spindle 25. Contactlessly supplying power to the PZT vibrator 33 by the contactless power supply device 35 enables the member to supply power without contacting the spindle 25, thus enabling the spindle 25 to rotate smoothly and make full use of the advantages offered by an air spindle mechanism.

Using the power supplied from the external power source in the manner described above, the PZT vibrator 33 generates ultrasonic vibrations and ultrasonically vibrates the spindle 25. The ultrasonic vibrations are transmitted axially along the spindle 25 (that is, along the Y-axis), toward the cutting blade 22 attached to the proximal end part 24 of the spindle 25. Further, the ultrasonic vibrations transmitted in this manner along the axis of the spindle 25 (in the Y-axis direction) are converted to the direction of the diameter of the cutting blade 22 (that is, the direction of the X-Z plane). The structure of the cutting blade 22 attachment mechanism, the frequency of the PZT vibrator 33 and so forth are adjusted so that the location on the Y-axis of this point of conversion of the direction of the transmission of the vibrations is at or near the location of the blade part 23 of the cutting blade 22 on the Y-axis.

The structure of the attachment mechanism of the cutting blade 22 according to the present embodiment will now be described in detail, using FIG. 3 described above.

As shown in FIG. 3, the cutting blade 22 according to the present embodiment is constructed so that, as described above, the hub base 21 and the blade part 23, which may be electrodeposited on the hub base 21, form a single integrated unit. Rod-shaped first joint part 21a and second joint part 21b, respectively, having diameters substantially equal to the proximal end part 24 of spindle 25 project latitudinally from both proximal and distal sides of the hub base 21 of the cutting blade 22. An end surface of the first joint part 21a (the flat surface at the left end of the hub base 21 in FIG. 3) forms a first joint surface with the adjustment member 40. An end surface of the second joint part 21b (the flat surface at the right end of the hub base 21 in FIG. 3) forms a second joint surface with the proximal end part 24 of the spindle 25. The shapes of the first and second joint surfaces are circles of substantially the same diameter as the proximal end part 24 of the spindle 25.

In addition, a base part through-hole 21c that completely penetrates the hub base 21 is formed in the hub base 21 along the axis of the spindle 25. The base part through-hole 21c is formed to a larger diameter than that of the body 29b of the bolt 29 described later, such that, when the body 29b of the bolt 29 is inserted in the base part through-hole 21c, the two are in a contactless state.]

The adjustment member 40 is formed of a metal material such as aluminum, and is in the shape of a rod corresponding to the proximal end part 24 of the spindle 25. The outer diameter of the rod-shaped adjustment member 40 is designed so as to be substantially identical to the outer diameter of the first joint part 21a of the hub base 21 of the cutting blade 22. The adjustment member 40 is joined to the first joint surface of the first joint part 21a of the hub base 21.

Figure 4:
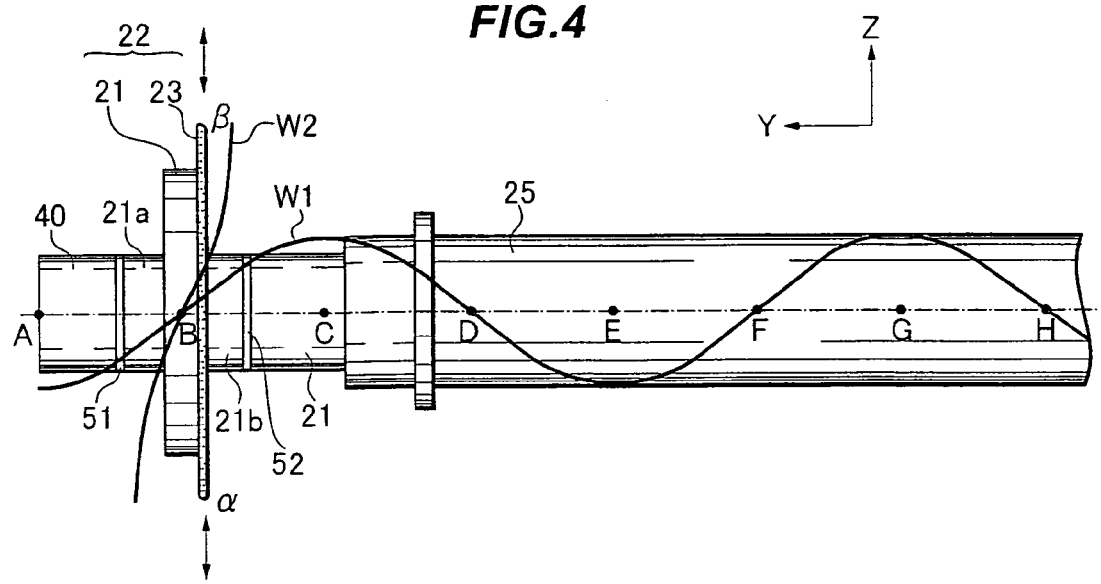
FIG. 4 is a diagram illustrating the principle of ultrasonically vibrating a cutting blade in the direction of the diameter of the blade according to the embodiment.

The adjustment member 40 is used to adjust the vibration state of the ultrasonic vibrations in response to the frequency of the ultrasonic vibrations transmitted axially from the spindle 25. Specifically, the adjustment member 40 is such that the axially transmitted ultrasonic vibrations reach a point of maximum vibration amplitude at the proximal end of the adjustment member 40 in the axial direction thereof (the left end part in FIG. 3), that is, a point that is at a distance of ¼ of the above-described ultrasonic vibration from the point at which the direction in which the ultrasonic vibrations are transmitted is changed, as shown in FIG. 4.

The bolt 29 is composed of a bolt head 29a that engages the adjustment member 40 and the bolt body 29b around the outer periphery of which are formed threads so as to create a male screw. The diameter of the bolt head 29a is designed to be of a size that can fit inside the adjustment member 40, and is larger than the diameter of the base part through-hole 21c in the cutting blade 22. At the same time, the diameter of the bolt body 29b is designed to be smaller than the diameter of the base part through-hole 21c. In addition, the bolt body 29b threads into a female screw hole 24a formed in the proximal end part 24 of the spindle 25.

The adjustment member 40, the hub base 21 of the cutting blade 22 and the proximal end part 24 of the spindle 25 are joined together by the bolt 29 having the construction described above, enabling the cutting blade 22 and the adjustment member 40 to be attached to and fixedly mounted on the proximal end part 24 of the spindle 25. At this time, the bolt head 29a anchors the adjustment member 40, and the bolt body 29b contactlessly penetrates the base part through-hole 21c of the cutting blade 22 and engages the proximal end part 24 of the spindle 25.

When joined, a first O-ring 51 that is one example of a first sealing member is inserted between the joint surface of the adjustment member 40 and the first joint surface of the hub base 21 of the cutting blade 22. A second O-ring 52 that is one example of a second sealing member is inserted between the second joint surface of the hub base 21 of the cutting blade 22 and the proximal end part 24 of the spindle 25. The first O-ring 51 and the second O-ring 52 are annular unevenness-absorption members made of a soft insulating material such as soft resin or paper.

The foregoing is a description of the main parts of the internal construction of the cutting unit 20 and the attachment mechanism of the cutting blade 22 of the present embodiment. The above-described construction enables the proximal end part 24 of the spindle 25, the hub base 21 of the cutting blade 22 and the adjustment member 40 to be joined optimally without gaps therebetween, in a nearly single integrated unit state. Further, the ultrasonic vibrations generated by the PZT vibrator 33 can be transmitted axially along the spindle 25 and, at a vibration transmission direction conversion point that is substantially identical in location to the cutting blade 22, the direction of transmission of the ultrasonic vibrations thus transmitted can be changed to the direction of the diameter of the cutting blade 22. Such an arrangement enables the workpiece 12 to be cut by the cutting blade 22 while ultrasonically vibrating the cutting blade 22 in the direction of the diameter of the blade, that is, while vibrating the ring-shaped blade part 23 so as to repeatedly alternately widen and narrow the track traced by the outer periphery of the blade part 23 at high frequency.

Although the principle of ultrasonically vibrating the cutting blade 22 in the direction of the diameter of the blade as described above is known, as described for example in JP-A-2000-210928 described above, a brief description is now given of this principle using FIG. 4.

FIG. 4 is a diagram illustrating a vibration waveform W1 that resonates with the ultrasonic vibration from the PZT vibrator 33 and a vibration waveform W2 whose direction of transmission has been converted to the direction of the diameter of the blade in the cutting unit 20 according to the present embodiment. The vibration waveform W1 shows a momentary displacement (vibration amplitude) of the ultrasonic vibration due to resonance. Vibration waveform W2 shows a momentary displacement (vibration amplitude) of the ultrasonic vibration whose direction of transmission has been converted to the direction of the diameter of the blade.

As shown in FIG. 4, points of maximum vibration amplitude A, C, E and G and points of minimum vibration amplitude B, D, F, H of vibration waveform W1 exist along the axis of the spindle 25 (along the Y-axis). Normally, at the points of maximum vibration amplitude A, C, E, G the extension of the spindle 25 in the direction of the diameter of the blade reaches its maximum. Therefore, the clearance between the spindle 25 and the spindle housing 26 must be larger than the maximum expanded diameter amount of the spindle 25 at least at the points of maximum vibration amplitude A, C, E, G However, as for the remaining points, since the cutting unit 20 employs an air spindle mechanism, there is no need for structural reinforcement of the spindle housing 26 at the points of maximum vibration amplitude A, C, E, G as is the case when a mechanical spindle mechanism is employed.

The minimum vibration amplitude point B of vibration waveform W1 is the point at which the direction of transmission of the vibration changes. The blade part 23 of the cutting blade 22 is disposed at or near this vibration transmission direction conversion point B along the Y-axis. At the vibration transmission direction conversion point B, the direction of transmission of the ultrasonic vibrations is changed from the axial direction of the spindle 25 (the Y-axis direction) to the direction of the diameter of the cutting blade 22 (the X-Z plane direction). The diameter of the cutting blade 22 is designed, and the frequency of the ultrasonic vibrations is adjusted so that the maximum vibration amplitude points α, β of the vibration waveform W2 whose direction of transmission has been changed to the direction of the diameter of the blade are located at the tip of the cutting blade 22.

Further, as described above, the hub base 21 and the blade part 23 of the cutting blade 22 are formed as a single integrated unit for optimal transmission and conversion of the above-described ultrasonic vibrations, and moreover, the adjustment member 40 and the hub base 21 of the cutting blade 22 and the proximal end part 24 of the spindle 25 are tightly sealed together and strongly fixed in place through the first O-ring 51 and the second O-ring 52. Further, the hub base 21 of the cutting blade 22 is formed so as to be symmetrically shaped along the Y-axis about the vibration transmission direction conversion point B, with the maximum vibration amplitude point A positioned at the proximal end part of the adjustment member 40.

Thus, as described above, by changing the direction of transmission of the ultrasonic vibrations that are transmitted axially along the spindle 25 to the direction of the diameter of the blade, the track traced by the outer periphery of the blade part 23 of the cutting blade 22 is repeatedly alternately widened and narrowed, and the tip of the cutting blade 22 ultrasonically vibrates optimally in the direction of the diameter of the blade.

By supplying power from the contactless power supply device 35 to the PZT vibrator 33, the cutting apparatus 10 equipped with the ultrasonic vibration cutting means described above can cause the cutting blade 22 to vibrate ultrasonically, and by stopping the supply of power from the contactless power supply device 35 to the PZT vibrator 33, the cutting apparatus 10 equipped with the ultrasonic vibration cutting means described above can cause the cutting blade 22 not to vibrate ultrasonically. In other words, the cutting apparatus 10 can be provided with a first cutting mode for cutting with the cutting blade 22 ultrasonically vibrated in the direction of the diameter of the blade and a second cutting mode for cutting with the cutting blade 22 not ultrasonically vibrated. The present embodiment uses a cutting apparatus 10 equipped with ultrasonic vibration cutting means capable of switching between these two cutting modes and cuts composite material formed from crystal material and amorphous material.

Figure 14:
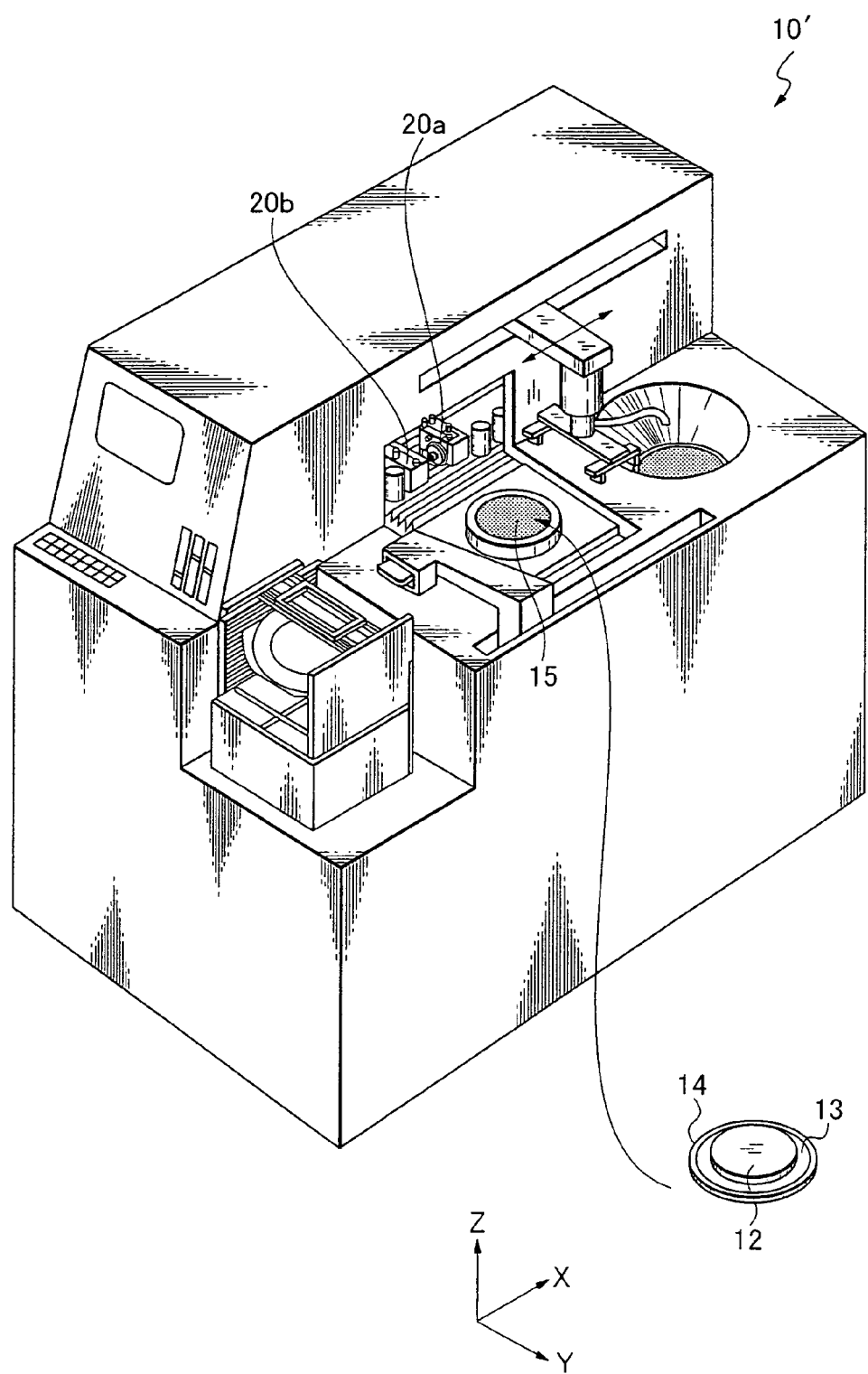
FIG. 14 is a schematic perspective view showing a variation of the cutting apparatus according to the embodiment.

In addition, in order to cut composite material formed from crystal material and amorphous material, for example, as shown in FIG. 14, it is also possible to use a cutting apparatus 10' that has two cutting means. Such cutting apparatus 10' is equipped with a first cutting unit 20a and a second cutting unit 20b. The first cutting unit 20a is an ultrasonic vibration cutting means that ultrasonically vibrates a first cutting blade in the direction of the diameter of the blade and cuts a workpiece. By contrast, the second cutting unit 20b is a cutting means that cuts the workpiece without ultrasonically vibrating a second cutting blade.

Figure 5A:
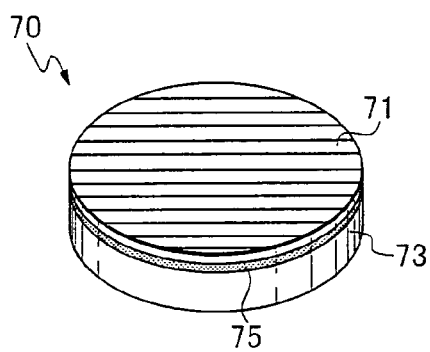
FIG. 5A is a schematic perspective view of a composite material of the embodiment.
Figure 5B:
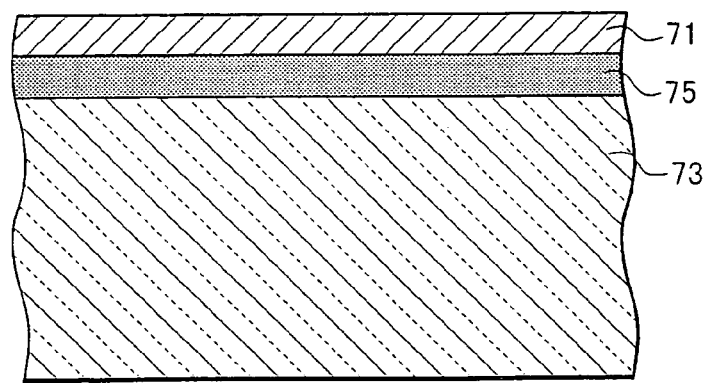
FIG. 5B is a partial sectional view of the composite material of the embodiment.

With the cutting apparatus 10', of a composite material 70 shown in FIGS. 5A and 5B, a silicon part 71 that is a crystal material portion can be cut with the second cutting unit 20b, which is an ordinary cutting means, and a glass part 73 that is an amorphous material portion can be cut with the first cutting unit 20a, which is an ultrasonic vibration cutting means.

The foregoing constitutes a description of the construction of the cutting apparatus 10 according to the present embodiment. Next, a method of cutting composite material composed of crystal material and amorphous material using the cutting apparatus 10 is described.

First, using FIGS. 5A and 5B, a description is given of the construction of the composite material that is the workpiece of the present embodiment. FIG. 5A is a schematic perspective view of a composite material of the embodiment and FIG. 5B is a partial sectional view of the composite material of the embodiment.

As shown in FIGS. 5A and 5B, the composite material 70 of the present embodiment is formed from a silicon part 71, which is the crystal material portion, and a glass part 73, which is an amorphous material portion, glued together with an adhesive agent 75. The thickness of the portions can be approximately 100 μm for the silicon part 71, approximately 700 μm for the glass part 73, and the thickness of the adhesive agent 75 that glues the silicon part 71 and the glass part 73 together can be approximately 45-100 μm. A circuit surface is formed on the surface of the side of the silicon part 71 that faces the glass part 73, with the adhesive agent provided on this circuit surface and the glass part 73 affixed thereto. In this specification, "crystal material" means a material having a cleavage such that the material fractures easily in a certain direction, for example, silicon, lithium tantalite, gallium nitride, silicon carbide and the like. By contrast, "amorphous material" means a material that has no cleavage (that is, no unidirectionality), for example, glass, ceramics and the like.

As a method of cutting without chipping the composite material 70 of this type, composed of a crystal material portion and an amorphous material portion, there are the first through fourth cutting methods described below.

(First Cutting Method)

Figure 7:
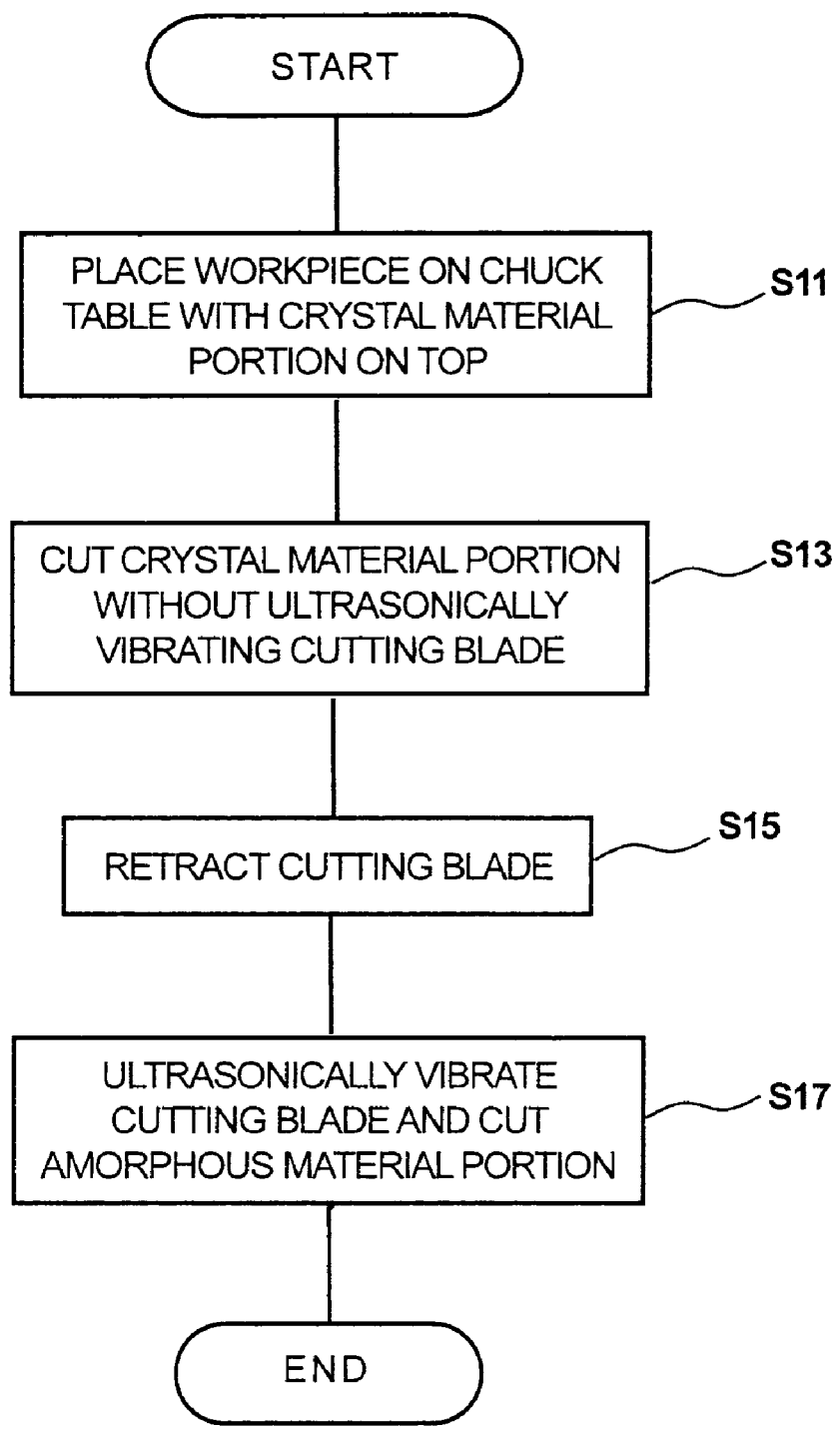
FIG. 7 is a flow chart illustrating the first cutting method.

First, using FIGS. 6 and 7, a first method for cutting the composite material 70 is described. FIG. 6 is a diagram illustrating steps in a cutting process according to a first cutting method. FIG. 7 is a flow chart illustrating the first cutting method.

In the first cutting method, first, dicing tape 13 is affixed to the front surface of the glass part 73 of the composite material 70, after which the composite material 70 is set on the chuck table 15 with the silicon part 71 facing up and the dicing tape 13 and the chuck table 15 in a state of contact with each other (step S11: Workpiece placement step).

Once the composite material 70 is set on the chuck table 15 with the silicon part 71 facing up, the streets that are the cutting lines cannot be seen from the silicon part 71 side. Consequently, it is necessary to detect the streets using, for example, an infrared (IR) camera. However, as shown in FIG. 5B, the glass part 73 is thick, and this thickness interposes distance between the circuit formed on the silicon part 71 and the dicing tape 13. As a result, there is the advantage that the impact that occurs when the dicing tape 13 is peeled off the glass part 73 is not readily transmitted to the silicon part 71, and thus the circuit is not easily damaged.

Then, using the cutting blade 22 set to the second cutting mode, the crystal material portion is cut (step S13: Crystal material portion cutting step). With the cutting method according to the present embodiment, the crystal material portion is cut with the cutting blade 22 not ultrasonically vibrated. Then, as shown in step (a) in FIG. 6, the blade part 23 of the cutting blade 22, which is set to the second cutting mode in which the cutting blade 22 is not ultrasonically vibrated, is forced into the silicon part 71, which is placed on top, and cuts until the tip of the blade part 23 reaches the adhesive agent 75; specifically, until the tip of the blade part 23 reaches a position that is within the range of the thickness of the adhesive agent 75 (approximately 45-100 μm), thus cutting completely through the silicon part 71.

Once the cutting of the silicon part 71 in step S13 is finished, the cutting blade 22 is temporarily retracted from the composite material 70 (step S15: Cutting blade retraction step). As shown in step (b) in FIG. 6, the blade part 23 of the cutting blade 22 is completely withdrawn from the interior of the composite material 70.

Then, using the cutting blade 22 set to the first cutting mode, the uncut amorphous material portion is cut (step S17: Amorphous material portion cutting step). In the cutting method according to the present embodiment, the amorphous material portion is cut with the cutting blade 22 ultrasonically vibrating in the direction of the diameter of the blade. Then, as shown in step (c) in FIG. 6, the apparatus is set to the first cutting mode, in which the cutting blade 22 is ultrasonically vibrated in the direction of the diameter of the blade, the blade part 23 is inserted in the cut groove formed in step S13, and the glass part 73 is cut. Then, when the tip of the blade part 23 reaches the dicing tape 13, cutting is ended. In this way, even the glass part 73 can be cut completely through.

Thus, as described above, with the first cutting method, the silicon part 71 of the composite material 70, which is placed on the chuck table 15 with the silicon part 71 facing up, is cut with the cutting blade 22 set to the second cutting mode and the glass part 73 is cut with the cutting blade 22 set to the first cutting mode, enabling composite material composed of crystal material and amorphous material to be cut cleanly.

(Second Cutting Method)

Figure 8:
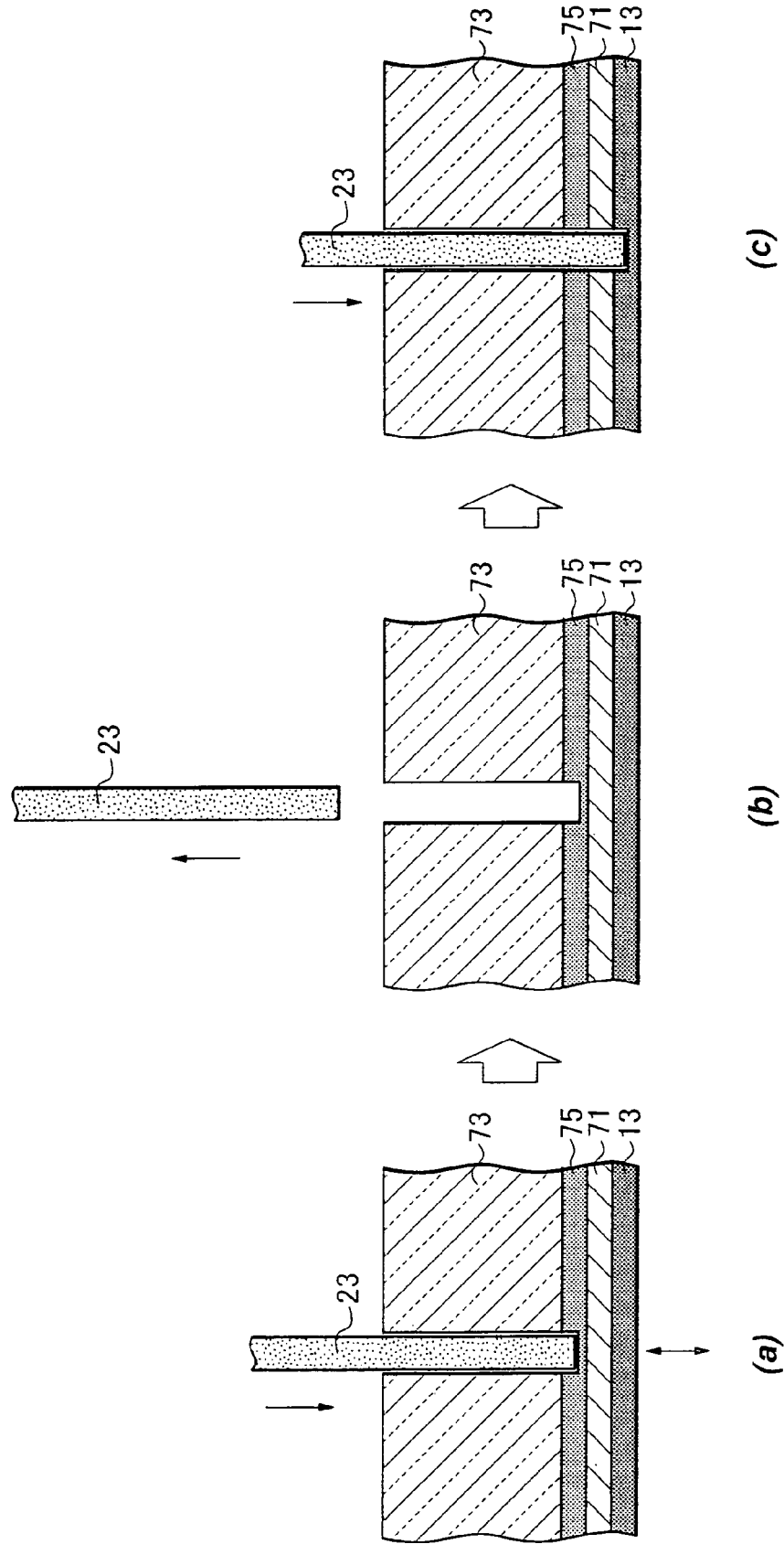
FIG. 8 is a diagram illustrating steps in a cutting process in a second cutting method.
Figure 9:
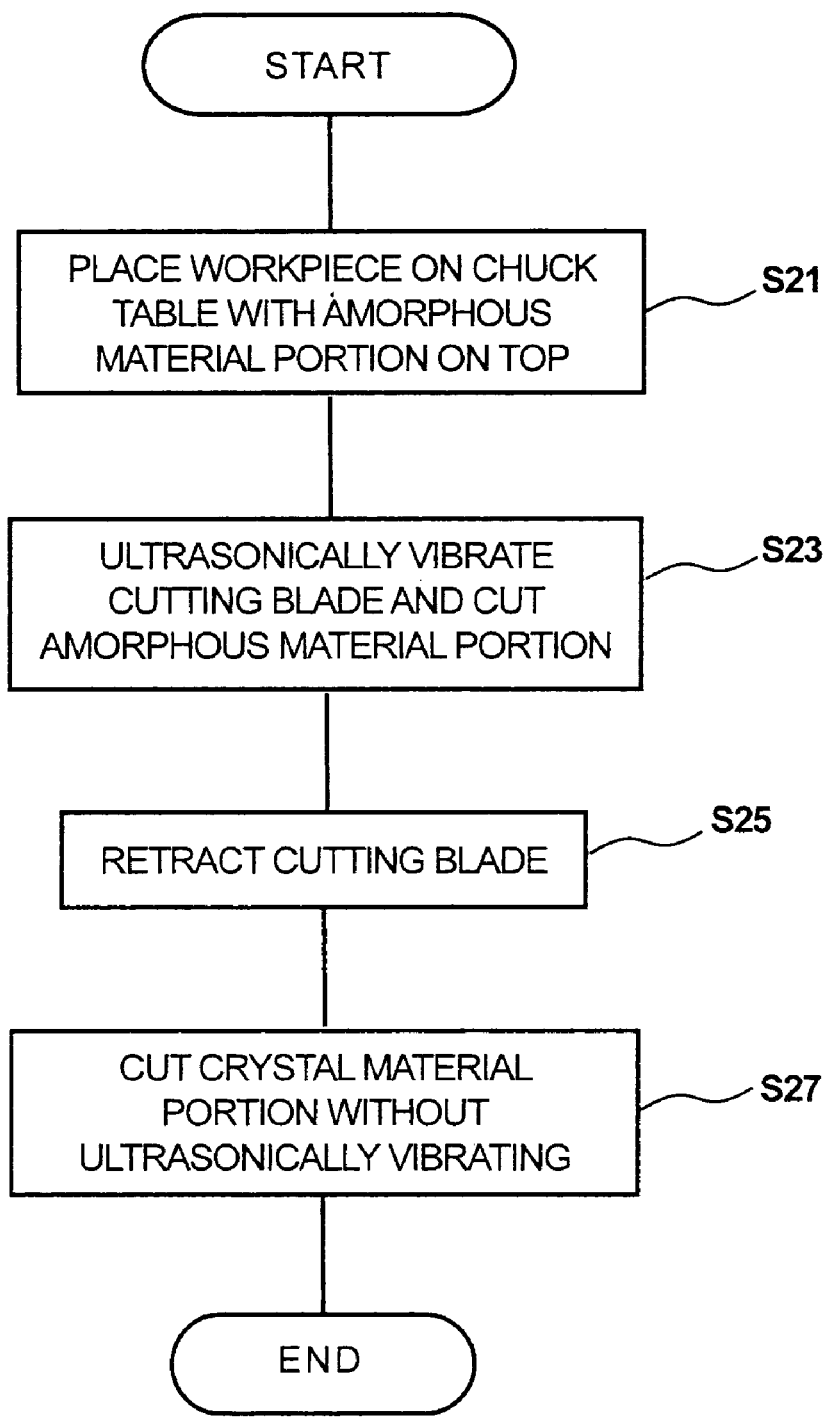
FIG. 9 is a flow chart illustrating the second cutting method.

Next, using FIGS. 8 and 9, a second method for cutting the composite material 70 is described. FIG. 8 is a diagram illustrating steps in a cutting process in the second cutting method. FIG. 9 is a flow chart illustrating the second cutting method.

In the second cutting method, first, the dicing tape 13 is affixed to the front surface of the silicon part 71 of the composite material 70, after which the composite material 70 is placed on the chuck table 15 with the glass part 73 facing up and the dicing tape 13 and the chuck table 15 in a state of contact with each other (step S21: Workpiece placement step).

If the composite material 70 is placed on the chuck table 15 with the glass part 73 facing up, the streets can be detected using an ordinary camera. However, it should be noted that, as shown in FIG. 5B, the silicon part 71 is relatively thin compared to the glass part 73, and therefore there is the problem that the impact arising when the dicing tape 13, which has adhesive force, is peeled off the silicon part 71 is readily transmitted to the circuit formed on the silicon part 71, thus easily damaging the circuit.

Next, the amorphous material portion is cut using the cutting blade 22 set to the first cutting mode (step S23: Amorphous material portion cutting step). In the cutting method according to the present embodiment, the amorphous material portion is cut with the cutting blade ultrasonically vibrating in the direction of the diameter of the blade. Accordingly, as shown in step (a) in FIG. 8, the blade part 23 of the cutting blade 22 that is set to the first cutting mode, in which the cutting blade 22 is ultrasonically vibrated in the direction of the diameter of the blade, is forced into the glass part 73, which is placed on the top side, and cuts until the tip of the blade part 23 reaches the adhesive agent 75; specifically, until the tip of the blade part 23 reaches a position that is within the range of the thickness of the adhesive agent 75 (approximately 45-100 μm), thus cutting completely through the glass part 73.

Once the cutting of the glass part 73 in step S23 is finished, the cutting blade 22 is temporarily retracted from the composite material 70 (step S25: Cutting blade retraction step). As shown in step (b) in FIG. 8, the blade part 23 of the cutting blade 22 is completely withdrawn from the interior of the composite material 70.

Then, using the cutting blade 22 set to the second cutting mode, the uncut crystal material portion is cut (step S27: Crystal material portion cutting step). In the cutting method according to the present embodiment, the crystal material portion is cut without ultrasonically vibrating the cutting blade 22. Thus, as shown in step (c) in FIG. 8, the apparatus is set to the second cutting mode, in which the cutting blade 22 does not ultrasonically vibrate, the blade part 23 is inserted in the cut groove formed in step S23, and the silicon part 71 is cut. Then, when the tip of the blade part 23 reaches the dicing tape 13, cutting is ended. In this way, even the silicon part 71 can be cut completely through.

Thus, as described above, with the second cutting method, the glass part 73 of the composite material 70, which is placed on the chuck table 15 with the glass part 73 facing up, is cut with the cutting blade 22 set to the first cutting mode, and the silicon part 71 is cut with the cutting blade 22 set to the second cutting mode, enabling composite material composed of crystal material and amorphous material to be cut cleanly.

(Third Cutting Method)

Figure 10:
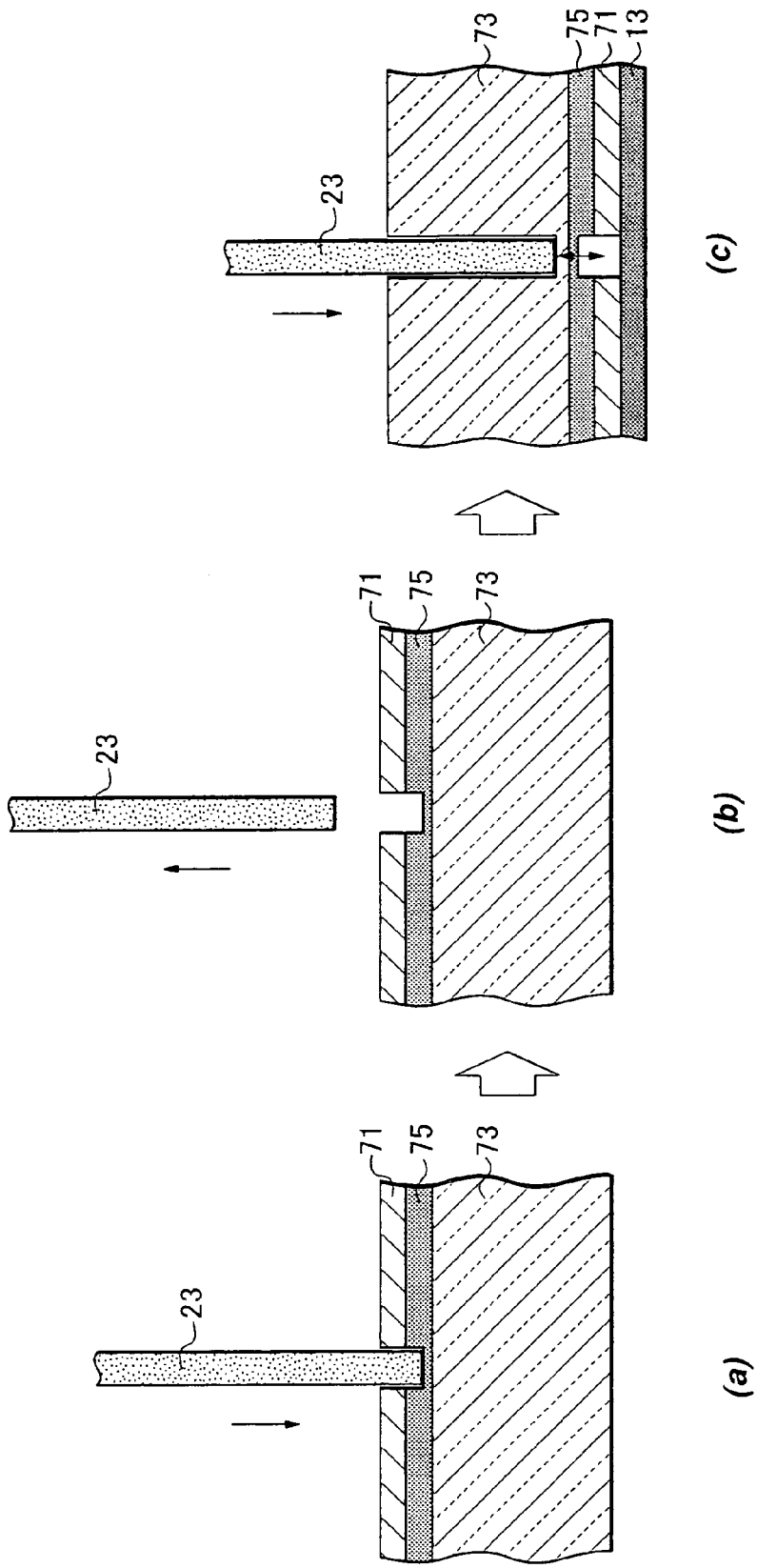
FIG. 10 is a diagram illustrating steps in a cutting process in a third cutting method.
Figure 11:
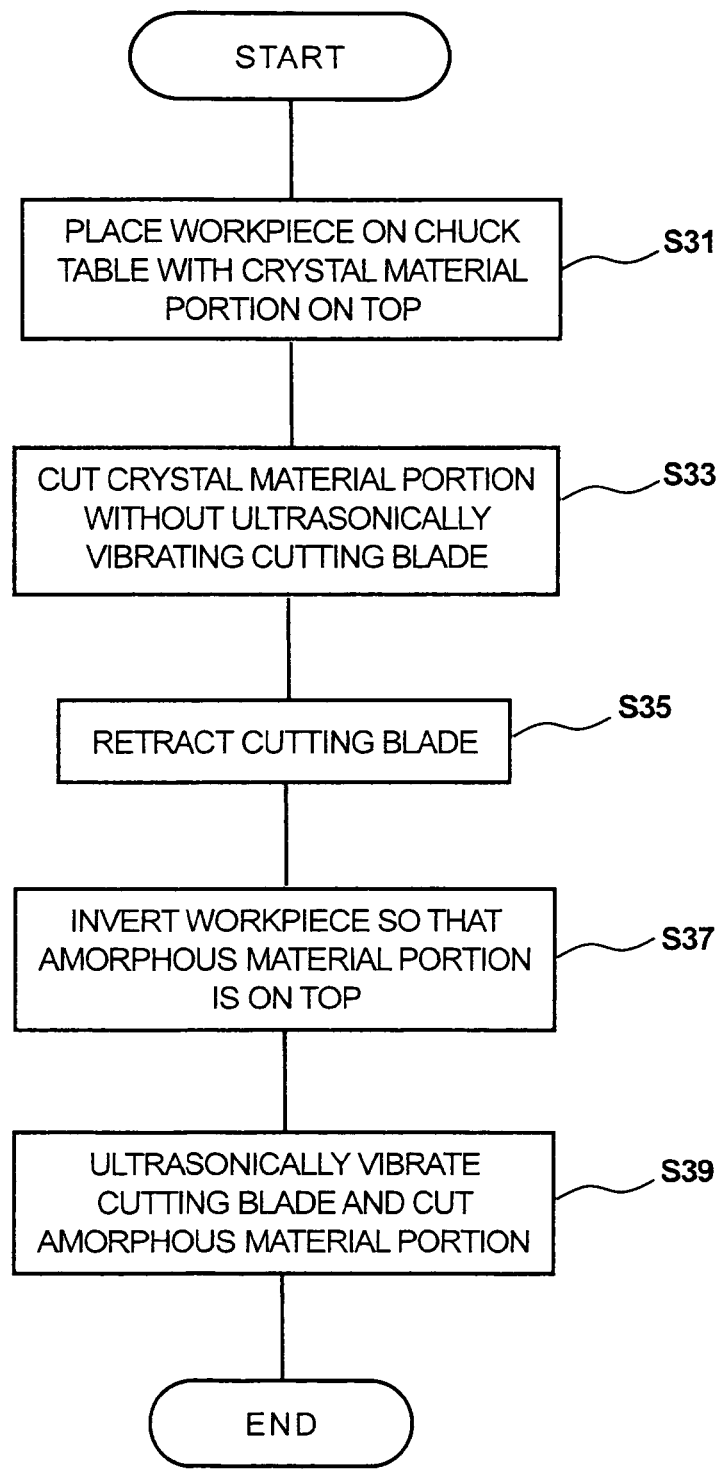
FIG. 11 is a diagram flow chart illustrating the third cutting method.

Next, using FIGS. 10 and 11, a third method for cutting the composite material 70 is described. FIG. 10 is a diagram illustrating steps in a cutting process according to the third cutting method. FIG. 11 is a flow chart illustrating the third cutting method.

In the third cutting method, first, the composite material 70 is set on the chuck table 15 with the silicon part 71 facing up (step S31: Workpiece placement step). In this case, since the composite material 70 is placed on the chuck table 15 with the silicon part 71 facing up, an infrared (IR) camera is used to detect the streets.

Then, using the cutting blade 22 set to the second cutting mode, the crystal material portion is cut (step S33: Crystal material portion cutting step). In the cutting method according to the present embodiment, the crystal material portion is cut with the cutting blade 22 not ultrasonically vibrated. Then, as shown in step (a) in FIG. 10, the blade part 23 of the cutting blade 22, which is set to the second cutting mode in which the cutting blade 22 is not ultrasonically vibrated, is forced into the silicon part 71, which is placed on top, and cuts until the tip of the blade part 23 reaches the adhesive agent 75; specifically, until the tip of the blade part 23 reaches a position that is within the range of the thickness of the adhesive agent 75 (approximately 45-100 µm), thus cutting completely through the silicon part 71.

Once the cutting of the silicon part 71 in step S33 is finished, the cutting blade 22 is temporarily retracted from the composite material 70 (step S35: Cutting blade retraction step). As shown in step (b) in FIG. 10, the blade part 23 of the cutting blade 22 is completely withdrawn from the interior of the composite material 70.

After the cutting blade 22 is retracted, the composite material 70 on the chuck table 15 is inverted (step S37: Composite material inversion step). At this time, the composite material 70 is placed on the chuck table 15 with dicing tape 13 affixed to the front surface of the now cut silicon part 71.

Then, using the cutting blade 22 set to the first cutting mode, the uncut amorphous material portion is cut (step S39: Amorphous material portion cutting step). In the cutting method according to the present embodiment, the amorphous material portion is cut with the cutting blade 22 ultrasonically vibrating in the direction of the diameter of the blade. Thus, as shown in step (c) in FIG. 10, the apparatus is set to the first cutting mode, in which the cutting blade 22 is ultrasonically vibrated in the direction of the diameter of the blade, the blade part 23 is forced into the glass part 73 at a position that is aligned with the cut groove formed in step S33, and the glass part 73 and the adhesive agent 75 not cut in step S33 are cut. Then, when the cut groove that is formed in the glass part 73 penetrates to the cut groove formed in step S33, cutting is ended.

The third cutting method is carried out by forcing the cutting blade 22 into the composite material 70 from opposite directions depending on the type of material to be cut. As a result, the third cutting method requires a step of inverting the composite material 70 once, and further, requires the accuracy to align the cut groove formed from the silicon part 71 side with the cut groove formed from the glass part side 73.

Thus, as described above, with the third cutting method, first, the silicon part 71 of the composite material 70, which is placed on the chuck table 15 with the silicon part 71 facing up, is cut with the cutting blade 22 set to the second cutting mode. Then, the composite material 70 is inverted to put the glass part 73 on top and the glass part 73 is cut with the cutting blade 22 set to the first cutting mode. Such an arrangement enables composite material composed of crystal material and amorphous material to be cut cleanly.

(Fourth Cutting Method)

Figure 12:
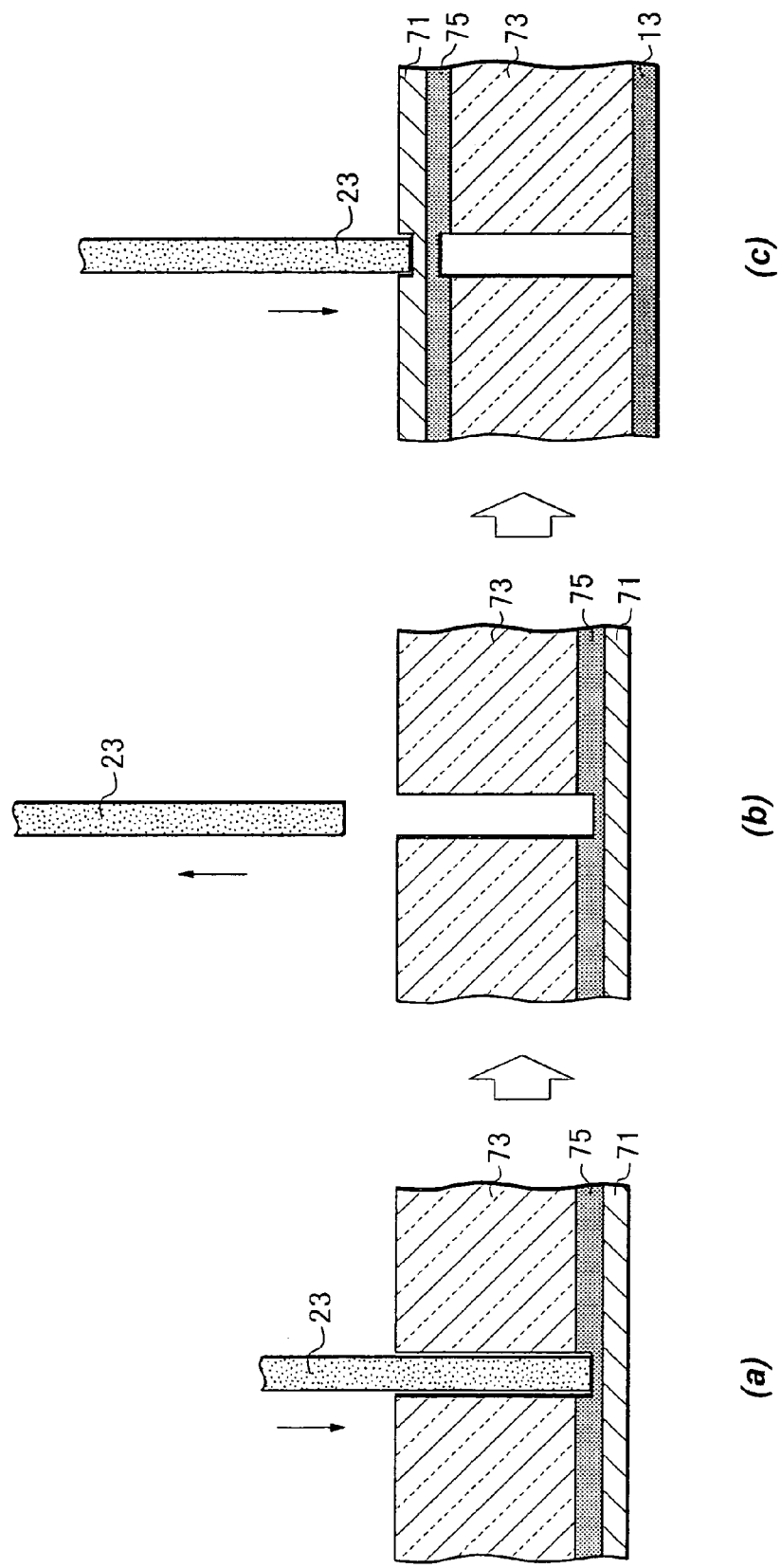
FIG. 12 is a diagram illustrating steps in a cutting process in a fourth cutting method.
Figure 13:
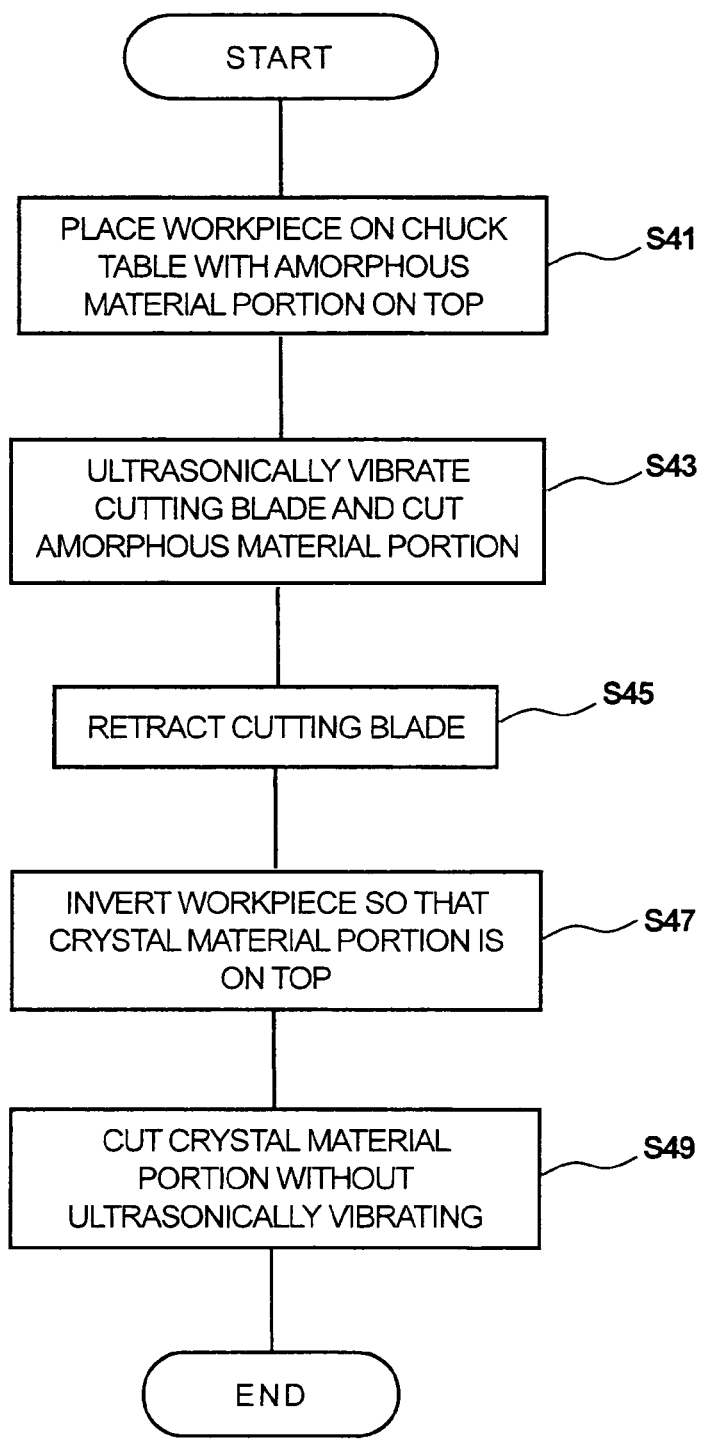
FIG. 13 is a diagram flow chart illustrating the fourth cutting method.

Next, using FIGS. 12 and 13, a fourth method for cutting the composite material 70 is described. FIG. 12 is a diagram illustrating steps in a cutting process in the fourth cutting method. FIG. 13 is a diagram flow chart illustrating the fourth cutting method.

With the fourth cutting method, first, the composite material 70 is placed on the chuck table 15 with the glass part 73 facing up (step S41: Workpiece placement step). At this time, as with step S31 in the third cutting method, the glass part 73 facing the chuck table 15 need not be fixed in place on the chuck table 15 by dicing tape 13.

Next, the amorphous material portion is cut using the cutting blade 22 set to the first cutting mode (step S43: Amorphous material portion cutting step). In the cutting method according to the present embodiment, the amorphous material portion is cut with the cutting blade ultrasonically vibrated in the direction of the diameter of the blade. Accordingly, as shown in step (a) in FIG. 12, the blade part 23 of the cutting blade 22 that is set to the first cutting mode, in which the cutting blade 22 is ultrasonically vibrated in the direction of the diameter of the blade, is forced into the glass part 73, which is placed on the top side, and cuts until the tip of the blade part 23 reaches the adhesive agent 75; specifically, until the tip of the blade part 23 reaches a position that is within the range of the thickness of the adhesive agent 75 (approximately 45-100 µm), thus cutting completely through the glass part 73.

Once the cutting of the glass part 73 in step S43 is finished, the cutting blade 22 is temporarily retracted from the composite material 70 (step S45: Cutting blade retraction step). As shown in step (b) in FIG. 12, the blade part 23 of the cutting blade 22 is completely withdrawn from the interior of the composite material 70.

After the cutting blade 22 is retracted, the composite material 70 on the chuck table 15 is inverted (step S47: Composite material inversion step). At this time, the composite material 70 is placed on the chuck table 15 with dicing tape 13 affixed to the front surface of the now cut glass part 73. In this case, since the composite material 70 is placed on the chuck table 15 with the silicon part 71 facing up, an infrared (IR) camera is used to detect the streets.

Then, using the cutting blade 22 set to the second cutting mode, the uncut crystal material portion is cut (step S49: Crystal material portion cutting step). In the cutting method according to the present embodiment, the crystal material portion is cut without ultrasonically vibrating the cutting blade 22. Thus, as shown in step (c) in FIG. 12, the apparatus is set to the second cutting mode, in which the cutting blade 22 does not ultrasonically vibrate, the blade part 23 is forced into the silicon part 71 at a position that matches the cut groove formed in step S43, and the silicon part 71 and the adhesive agent 75 not cut in step S43 are cut. Then, when the cut groove that is formed in the silicon part 71 penetrates to the cut groove formed in step S43, cutting is ended.

The fourth cutting method, like the third cutting method, is carried out by forcing the cutting blade 22 into the composite material 70 from different directions depending on the type of material to be cut. As a result, the fourth cutting method requires a step of inverting the composite material 70 once, and further, requires the accuracy to align the cut groove formed from the silicon part 71 side with the cut groove formed from the glass part side 73.

Thus, as described above, with the fourth cutting method, first, the glass part 73 of the composite material 70, which is placed on the chuck table 15 with the glass part 73 facing up, is cut with the cutting blade 22 set to the first cutting mode. Then, the composite material 70 is inverted to put the silicon part 71 on top and the silicon part 71 is cut with the cutting blade 22 set to the second cutting mode. Such an arrangement enables composite material composed of crystal material and amorphous material to be cut cleanly.

The foregoing constitutes a description of first through fourth cutting methods, in which cutting the crystal material portion and the amorphous material portion that form the composite material 70 using with cutting modes best suited to each material portion enables composite material 70 to be cut cleanly. It should be noted that, in the first cutting method and the second cutting method, the process of cutting the silicon part 71 and the process of cutting the glass part 73 are carried out by fording the cutting blade 22 into the composite material 70 from the same direction. By contrast, in the third cutting method and the fourth cutting method, these processes are carried out by forcing the cutting blade 22 into the composite material 70 from opposite directions. As a result, these latter two methods require a step of inverting the composite material 70 once, and further, require the accuracy to align the cut groove formed from the silicon part 71 side with the cut groove formed from the glass part side 73.

In addition, although in the first through fourth cutting methods are described using the cutting apparatus 10, the composite material 70 can be similarly cut using the cutting apparatus 10' shown in FIG. 14 as well, by cutting the amorphous material portion with the first cutting means 20a, which is an ultrasonic vibration cutting means, and cutting the crystal material portion using the second cutting means 20b, which is an ordinary cutting means.

The foregoing constitutes a description of a cutting apparatus according to the first embodiment of the present invention and of methods of cutting composite material using this cutting apparatus. As described above, cutting glass and other amorphous material using a cutting blade 22 that vibrates ultrasonically yet cutting silicon or other crystal material using a cutting blade 22 that does not vibrate ultrasonically enables composite material 70 composed of crystal material and amorphous material to be cut cleanly without chipping.

Next, in order to confirm the effect of the methods of cutting the composite material 70 described above, the composite material 70 was cut using the first cutting method using the cutting apparatus 10. This test example is shown below.

TEST EXAMPLE

The cutting apparatus used as the embodiment comprises a single cutting means, capable of switching between a cutting mode that cuts by ultrasonically vibrating the cutting blade in the direction of the diameter of the blade (a first cutting mode) and a normal cutting mode that cuts without ultrasonically vibrating the cutting blade (a second cutting mode). Cutting mode switching can be accomplished by switching power to the ultrasonic vibrator ON and OFF. Using this cutting apparatus, composite material consisting of silicon and glass bonded by an adhesive agent was cut under the following conditions: The size of the composite material used in this embodiment was 2 inches, the thickness of the silicon part was approximately 100 µm, the thickness of the glass part was approximately 700 µm, and the thickness of the adhesive agent was approximately 100 µm.

First, the composite material was placed on the chuck table with the silicon part on top and cut from the silicon part side. The cutting of the silicon part is performed using the cutting blade set to the normal cutting mode. The depth of the cut of the cutting blade is equal to or greater than the thickness of the silicon part (approximately 100 µm) and within a range that adds the thickness of the adhesive agent to the thickness of the silicon part; in other words, between 100 and 200 µm from the starting point of the cut of the cutting blade (that is, the surface of the composite material that faces the cutting blade).

Next, the silicon part is cut into a grid, after which the glass part is cut into a grid. The cutting of the glass part is accomplished using the cutting blade set to the cutting mode in which the cutting blade is ultrasonically vibrated in the direction of the diameter of the blade. The cutting of the glass part is accomplished by inserting an ultrasonically vibrating cutting blade into the cut groove formed in the silicon part. At this time, the depth of the cut of the cutting blade is acceptable if it is approximately 900 µm or more from the start of the cut by the cutting blade 22; that is, within a range that is the sum of the respective thickness of the silicon part, the adhesive agent and the glass part combined.

It should be noted that the cutting blade 22 used in the cutting described above was an electroform blade (#2000; thickness: 0.07 mm); spindle rpm was approximately 15 krpm; and cutting blade feed speed was approximately 10 mm/sec when cutting silicon and approximately 1 mm/sec when cutting glass. In addition, the output frequency of the ultrasonic vibrator (electrostrictive vibrator) was approximately 70 kHz, at which time the amplitude of the tip of the cutting blade 22 was approximately 5 µm.

When the composite material was cut under these cutting conditions, the maximum size of chipping of the front surface of the silicon part was approximately 13 µm and the maximum size of chipping of the rear surface of the glass part was approximately 5 µm. In addition, in the rear surface of the silicon part, that is, the surface coated with the adhesive agent, no cracks appeared at all. From this, it was clear that composite material composed of crystal material and amorphous material can be worked optimally by cutting the glass part with a cutting blade that is ultrasonically vibrated in the direction of the diameter of the blade and cutting the silicon part with a cutting blade that is not ultrasonically vibrated. It should be noted that the same effect was obtained using the cutting apparatus 10' shown in FIG. 14 and cutting the composite material 70 using the first cutting method.

The present invention is adaptable to a method for cutting a workpiece and to a cutting apparatus for cutting a workpiece, in particular, to a method for cutting composite material and to a cutting apparatus for cutting composite material.

As many apparently widely different embodiments and variations of the present invention can be made without departing from the spirit and scope thereof, it is to be understood that the present invention is not limited to the specific embodiments thereof described herein but rather only to the extent set forth in the following claims.

What is claimed is:

1. A cutting method for cutting with a cutting blade composite material in which crystal material and amorphous material are joined together, the cutting method comprising the steps of:
   cutting the amorphous material portion of said composite material while ultrasonically vibrating said cutting blade in a direction of the diameter of the cutting blade; and
   cutting the crystal material portion of said composite material without ultrasonically vibrating said cutting blade.

2. The cutting method according to claim 1, wherein cutting is carried out using a cutting apparatus comprising cutting means adapted to switch between a first cutting mode that cuts a workpiece by ultrasonically vibrating said cutting blade in the direction of the diameter of the cutting blade and a second cutting mode that cuts the workpiece without ultrasonically vibrating said cutting blade, and switching between the first cutting mode and the second cutting mode.

3. The cutting method according to claim 2, wherein the amorphous material is glass and the crystal material is silicon.

4. The cutting method according to claim 1, using a cutting apparatus comprising first cutting means for cutting a workpiece by ultrasonically vibrating a first cutting blade in the direction of the diameter of the cutting blade and second cutting means for cutting a workpiece without ultrasonically vibrating a second cutting blade;
   cutting the amorphous material portion of said composite material with said first cutting means; and
   cutting the crystal material portion of said composite material with said second cutting means.

5. The cutting method according to claim 4, wherein the amorphous material is glass and the crystal material is silicon.

6. The cutting method according to claim 1, wherein said cutting blade is inserted into said composite material from the same direction in the step of cutting the amorphous material portion and in the step of cutting the crystal material portion.

7. The cutting method according to claim 6, wherein the amorphous material is glass and the crystal material is silicon.

8. The cutting method according to claim 1, wherein said cutting blade is inserted into said composite material from opposite directions in the step of cutting the amorphous material portion and in the step of cutting the crystal material portion.

9. The cutting method according to claim 8, wherein the amorphous material is glass and the crystal material is silicon.

10. The cutting method according to claim 1, wherein the amorphous material is glass and the crystal material is silicon.

* * * * *